United States Patent [19]
Funaki et al.

[11] Patent Number: 5,815,414
[45] Date of Patent: Sep. 29, 1998

[54] ELECTROMAGNETIC FIELD INTENSITY CALCULATING DEVICE

[75] Inventors: Kazuki Funaki; Tomoyuki Nakao, both of Kawasaki, Japan

[73] Assignee: Fujitsu Limited, Kawasaki, Japan

[21] Appl. No.: 546,535

[22] Filed: Oct. 20, 1995

[30] Foreign Application Priority Data

Oct. 21, 1994 [JP] Japan .................................. 6-256372

[51] Int. Cl.⁶ ........................................... G06F 9/455
[52] U.S. Cl. ........................... 364/578; 364/484; 364/485
[58] Field of Search .................... 364/578, 484, 364/485

[56] References Cited

PUBLICATIONS

IEEE Standards Report, "State–of–the–Art of Measuring Field Strength, Continuous Wave Sinusoidal", pp. 1–7, 1968.

Hayt, William H. Jr, "Engineering Electromagnetics," chapter 13, pp. 414–426, 1989.

*Primary Examiner*—Kevin J. Teska
*Assistant Examiner*—Russell W. Frejd
*Attorney, Agent, or Firm*—Staas & Halsey

[57] ABSTRACT

An electromagnetic field intensity calculating device simulates the intensity of the electromagnetic field generated by an electric circuit, and performs a required simulation process at a high speed. That is, the electromagnetic field intensity calculating device simulates the electromagnetic field intensity generated by an object electric circuit device by processing an object frequency generated by the object electric circuit device. The electromagnetic field intensity calculating device comprises a calculating unit for calculating the resonant frequency of the object electric circuit device and a retrieving unit for retrieving from a plurality of object frequencies a harmonic frequency of a wave source approximate to the resonant frequency calculated by the calculating unit so that the electromagnetic field intensity can be simulated on the frequency retrieved by the retrieving unit.

23 Claims, 11 Drawing Sheets

ELECTROMAGNETIC FIELD INTENSITY CALCULATING DEVICE

BACKGROUND OF THE INVENTION

1. Field of the Invention

The present invention relates to an electromagnetic field intensity calculating device for simulating the intensity of the electromagnetic field generated by an electric circuit, and more specifically to an electromagnetic field intensity calculating device for performing a required simulation process at a high speed.

2. Description of the Prior Art

A lot of electric devices are commonly used these days. They include power devices which consume a large amount of electric power, and various kinds of electronic devices. Particularly, the power devices generate strong undesired electric waves. Even the electronic devices generate the undesired electric waves from their built-in circuit elements such as transformers, power transistors, etc. Since the undesired electric waves generated by the electric circuit devices (electric devices) interfere other electric waves such as radio, television, etc., there have been strict restrictions placed in many countries.

Various countermeasures such as shielding technology, filtering technology, etc. are required to meet these restrictions on the electric waves. These countermeasures need quantitative simulation to prove how the electric waves can be reduced, and the simulation process should be performed at a high speed.

The electromagnetic field intensity of an object can be simulated by obtaining the electric current in each point of the object and substituting the obtained current in a well-known logical expression of the generation of electric waves. A moment method is a typical simulation process. It is one of the integral equations derived from the Maxwell electromagnetic wave equation for use in calculating the electronic current in each element of an object after dividing the object into small elements. In the electromagnetic field intensity calculating device according to the moment method, the simulation is performed with the frequency of a generated electromagnetic wave properly assumed (assumed are the basic frequency of the wave source of an object and its harmonic frequency).

Since it takes a long time to analyze all frequencies, the operator selects, in the conventional methods, some frequencies to be analyzed to perform simulation on the selected frequencies and then further select the frequencies to perform simulation around suspect frequencies.

However, with the configuration in which the electromagnetic field intensity is calculated on the frequencies selected by the operator, the electromagnetic field intensity can be calculated only on the selected frequencies, which may not include the worst frequency, and the most suspect frequency can be unfortunately missed. To prevent this, all frequencies should be completely analyzed with an unpractically long time consumed.

SUMMARY OF THE INVENTION

The present invention aims at providing a new electromagnetic field intensity calculating device for performing a simulation process on the required electromagnetic field intensity at a high speed.

According to the present invention, the electromagnetic field intensity of the frequency of the electric wave generated by an object electric circuit device is calculated based on the moment method, etc. By outputting the structure information of the electric circuit device, the resonant frequency of the electric circuit device can be calculated and that harmonics frequency of the wave source frequency which is generated by the object electric device and is approximate to the calculated resonant frequency can be retrieved, to provide the object frequency whose electromagnetic field intensity is to be measured, and based on which the electromagnetic field intensity of the electric circuit device can be calculated. These processes allow the simulation of the electromagnetic field intensity to be performed only on the electric magnetic wave having the frequency that is possibly generated by the electric circuit device and the intensity of the electromagnetic wave generated from the object electric device is possibly at maximum, thereby quickly measuring the electromagnetic field intensity.

The calculation of the resonant frequency is made by the above described calculating process based on the input impedance of the circuit in the electric circuit device; the physical dimension of the aperture of the structure of the electric circuit device; the outer dimension of the structure of the electric circuit device; the length of the cable of the electric circuit device; or the intervals of connection points in the structure of the electric circuit device.

DESCRIPTION OF THE PREFERRED EMBODIMENTS

The present invention is described in detail by referring to the embodiments.

Figure 1:
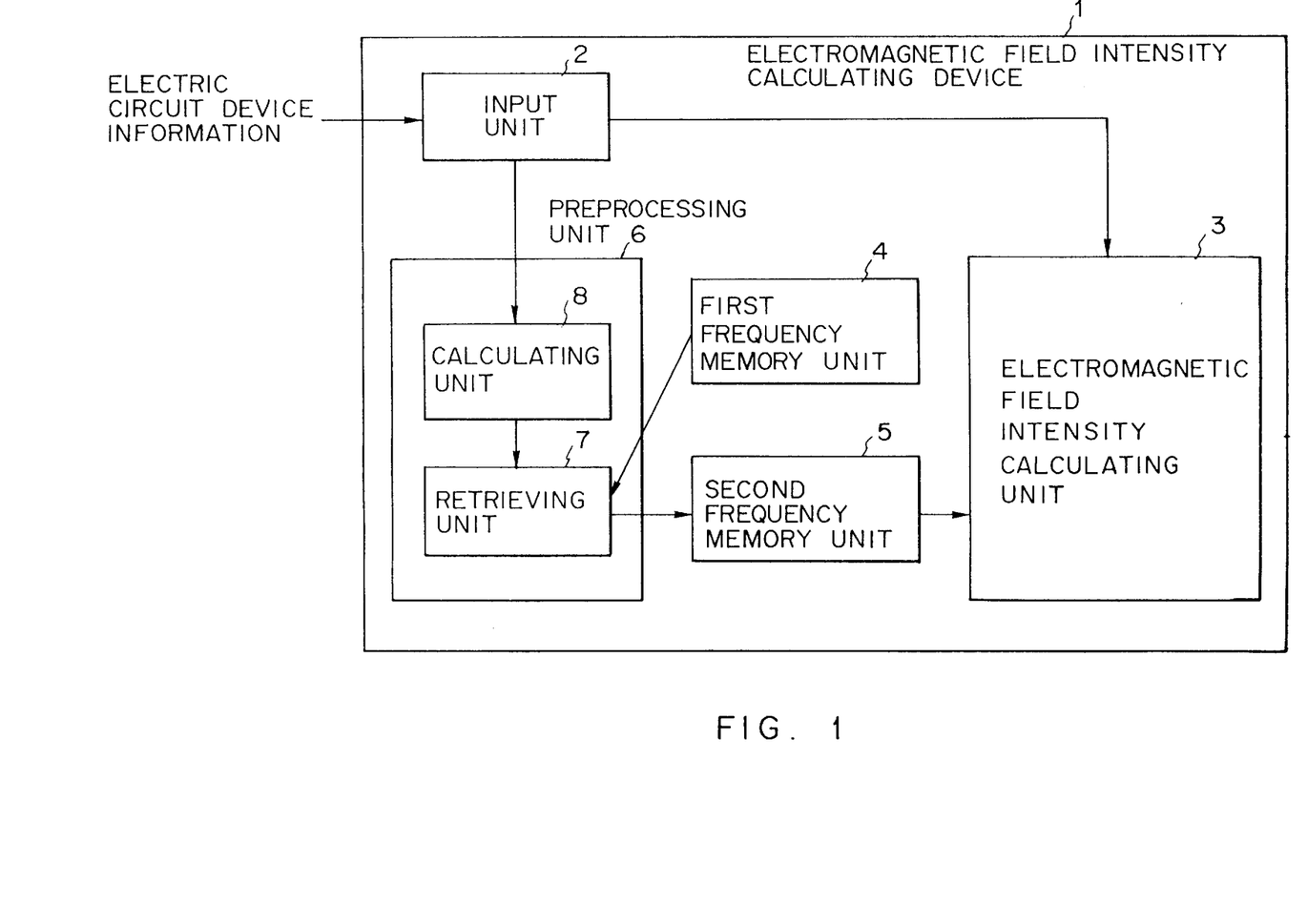
FIG. 1 shows the principle of the present invention.

FIG. 1 shows the principle of the present invention. In FIG. 1, an electromagnetic field intensity calculating device 1 calculates the electromagnetic field intensity of the electric circuit device to be analyzed according to the moment method, etc.

The electromagnetic field intensity calculating device 1 comprises an input unit 2; an electromagnetic field intensity calculating unit 3; a first frequency memory unit 4; a second frequency memory unit 5; and a preprocessing unit 6.

The input unit 2 inputs structure information about an object electric circuit device through a CAD system, etc. The electromagnetic field intensity calculating unit 3 receives from the input unit 2 the structure information about the object electric circuit device to calculate the electromagnetic field intensity of the frequency of the electric wave generated by the object electric circuit device based on the moment method, etc. when the frequency to be analyzed is provided.

The first frequency memory unit 4 stores a frequency which can be generated by an object electric circuit device, i.e. a frequency of a wave source provided in the object electric circuit device and the harmonics thereof. The second frequency memory unit 5 stores an object frequency to be provided for the electromagnetic field intensity calculating unit 3.

The preprocessing unit 6 comprises a calculating unit 8 for calculating the resonant frequency of the electric circuit device and a retrieving unit 7 for determining and storing the frequency to be stored in the second frequency memory unit 5.

Upon receipt of the structure information about the object electric circuit device from the input unit 2 according to the present invention, the resonance frequency calculating unit 8 calculates the resonant frequency of the electric circuit device. For example, the resonant frequency of the object electric circuit device can be calculated by obtaining the resonant frequency from the input impedance of the circuit of the electric circuit device, obtaining the resonant frequency from the physical dimensions of the aperture of the structure of the electric circuit device, obtaining the resonant frequency from the length of the cable of the electric circuit device, or obtaining the resonant frequency from the gap at the joint in the structure of the electric circuit device.

As a result of the calculation of the resonant frequency, the retrieving unit 7 retrieves the harmonic frequency of the wave source approximate to the calculated resonant frequency of the frequencies stored in the first frequency memory unit 4, and stores it in the second frequency memory unit 5.

When the frequency is stored in the second frequency memory unit 5, the electromagnetic field intensity calculating unit 3 calculates the electromagnetic field intensity of the frequencies generated by the object electric circuit device using the frequency to be stored in the second frequency memory unit 5 as the object of the analysis.

Thus, the electromagnetic field intensity calculating device 1 does not calculate the electromagnetic field intensity for all the frequencies stored in the first frequency memory unit 4, but selects only the frequency which generates a high electromagnetic field intensity level when it is a resonant frequency, calculates the electromagnetic field intensity of the selected frequencies, and successfully calculates the requested electromagnetic field intensity at a high speed.

Figure 2:
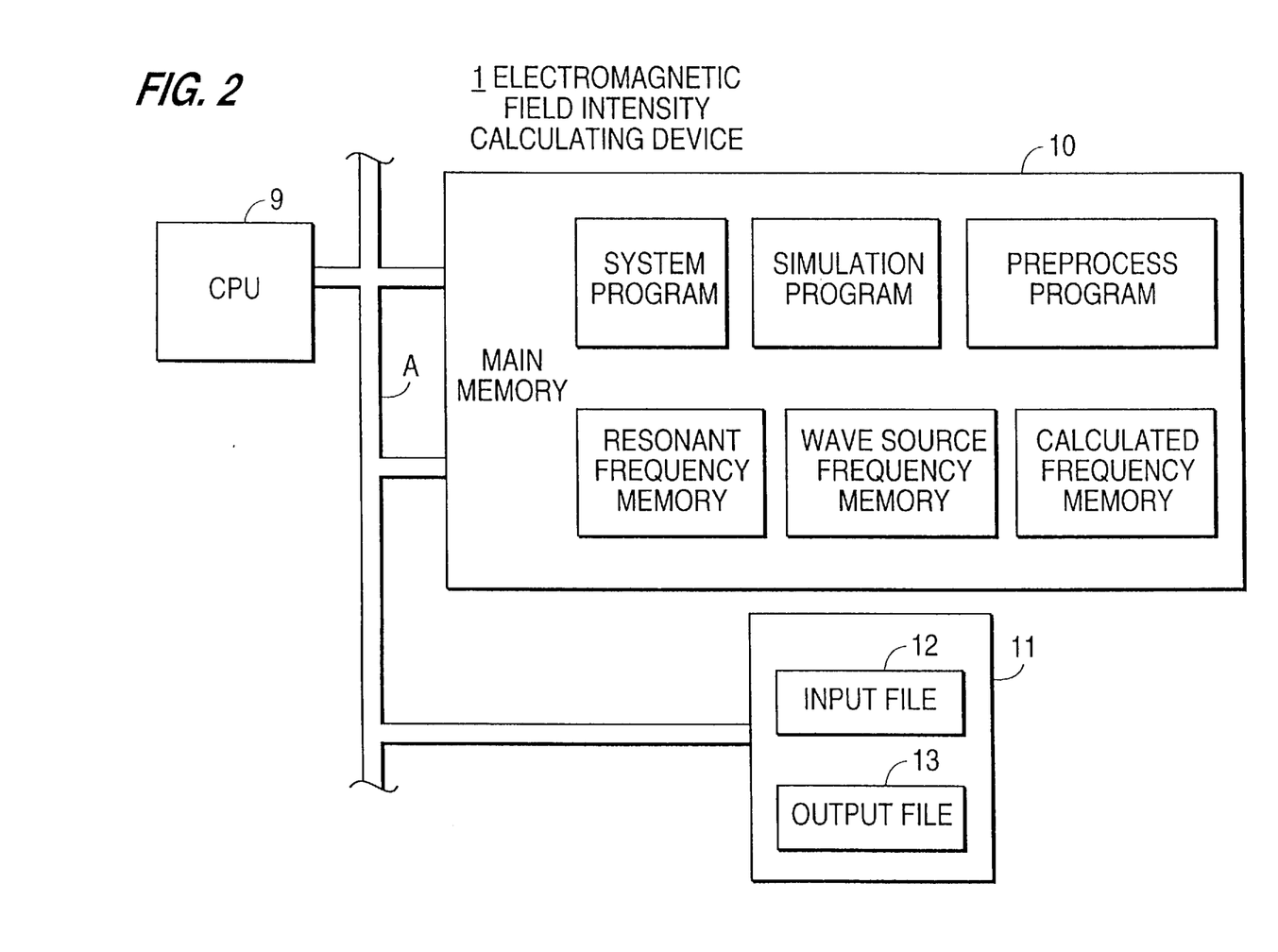
FIG. 2 shows the system according to an embodiment of the present invention.

FIG. 2 shows the configuration of the electromagnetic field intensity calculating device 1 according to the present embodiment. In FIG. 2, the CPU 9 is a central processing device for controlling the entire system of the electromagnetic field intensity calculating device 1 according to the present embodiment, and functions based on the system program stored in the main memory 10. The main memory is connected to the CPU 9 through the bus A, and stores, in addition to the above described system program, a simulation program and a pre-process program described later. Outputting these programs to the CPU 9 allows the CPU 9 to perform corresponding processes. Therefore, together with the main memory 10, the CPU 9 also functions as preprocessing unit for performing the preprocess program. For example, it functions a resonant frequency calculating unit for calculating the resonant frequency according to the structure information about an object which is obtained from, for example, an input file. Together with the main memory 10, the CPU 9 also functions a calculated frequency retrieving unit for retrieving the calculated frequency according to the result calculated by the resonant frequency calculating unit. The CPU 9 also functions as electromagnetic field intensity calculating unit for performing the above described simulation program, and calculates the electromagnetic field intensity of the object according to the resonant frequency.

Furthermore, main memory 10 comprises a resonant frequency memory for storing the result calculated by the resonant frequency calculating unit; a wave source frequency memory for storing predetermined wave source frequency; and calculated frequency memory for storing the result retrieved by the above described retrieving unit.

The CPU 9 is also connected to the keyboard and display via the bus A, and selects and performs the simulation program and preprocess program. The display displays the process results obtained by the CPU 9 such as the data of the calculated frequency obtained by retrieval by the retrieving unit, the data, output to the output file described above, etc.

An external storage device 11 is connected to the bus A. The external storage device 11 is, for example, an input file 12 or an output file 13. The input file 12 stores the structure information, that is, the data about an object, obtained as divided from an electric circuit device (object) to be processed by the electromagnetic field intensity calculating device 1 according to the present embodiment. For example, the data can be the outer dimensions and aperture of the object, cable length, etc. The output file 13 stores the calculation result from the electromagnetic field intensity calculating device 1 about the electromagnetic field intensity of the object. The calculation result is stored together with the frequency data. The external storage device can be a hard disc or a magnetic disc.

Figure 3:
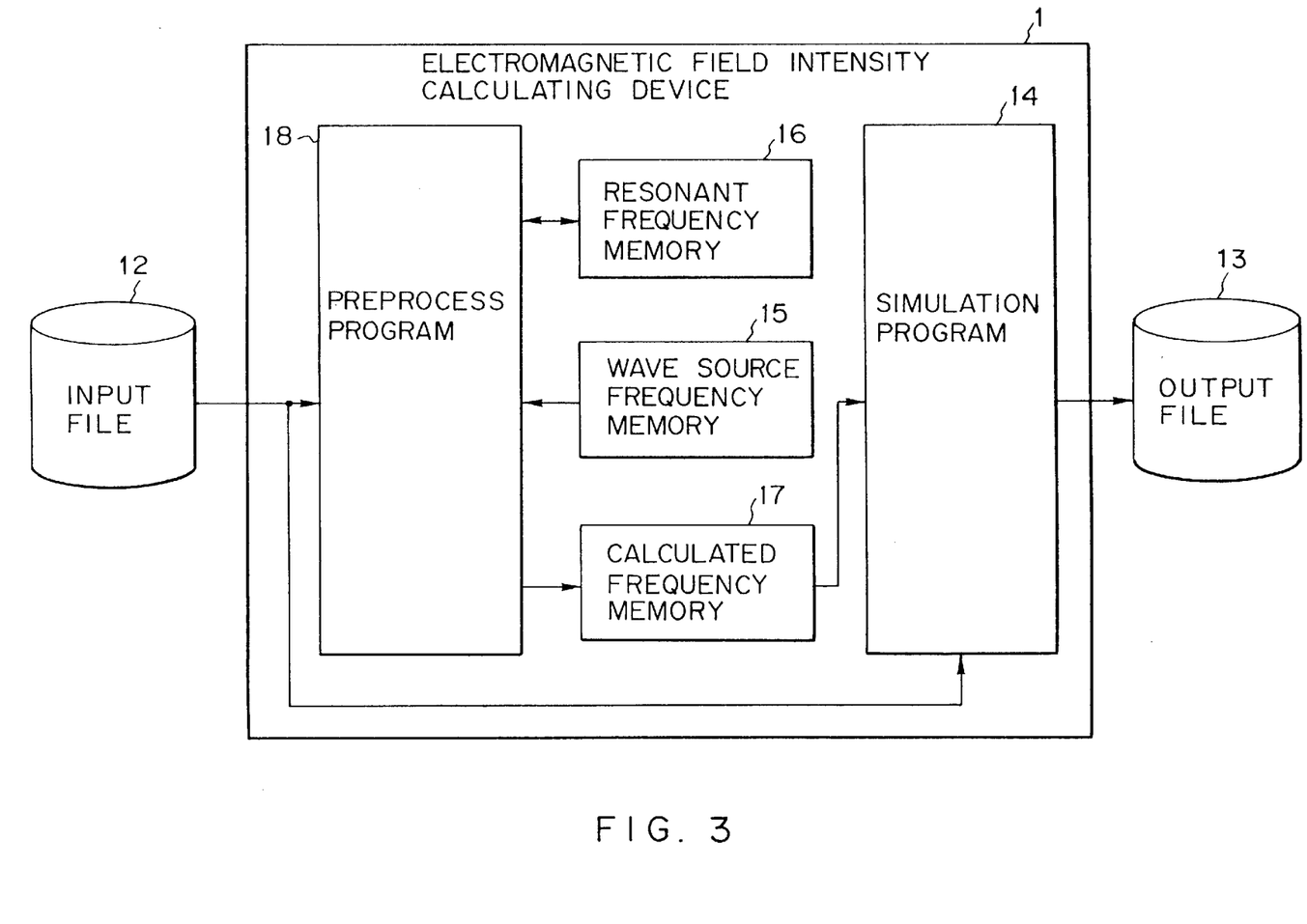
FIG. 3 shows an embodiment of the present invention.

FIG. 3 shows the relationships between the above described simulation program and preprocess program, and among the resonant frequency memory RAS, wave source frequency memory, and calculated frequency memory, including the input file 12 and output file 13. The electromagnetic field intensity calculating device 1 according to the present embodiment calculates the electromagnetic field intensity generated by an electronic device to be processed. As shown in FIG. 3, the output file 13 comprises the simulation program 14, wave source frequency memory 15, resonant frequency memory 16, calculated frequency memory 17, and preprocess program 18 to realize the present invention. When the simulation program 14 receives the structure information obtained as divided from the object electric circuit device from the input file 12 and is given the frequency of the object, it calculates the electromagnetic field intensity of the frequency generated by the object electric circuit device according to the moment method.

The wave source frequency memory 15 stores the basic frequency (from the input file 12) of the wave source of the object electric circuit device, and also stores its harmonic frequency. The resonant frequency memory 16 stores the resonant frequency of the object electric circuit device. The calculated frequency memory 17 stores the object frequency to be provided for the simulation program 14.

The preprocess program 18 calculates the resonant frequency of the object electric circuit device and stores it in the resonant frequency memory 16, and then calculates the object frequency to be provided for the simulation program 14 and stores it in the calculated frequency memory 17.

Figure 4:
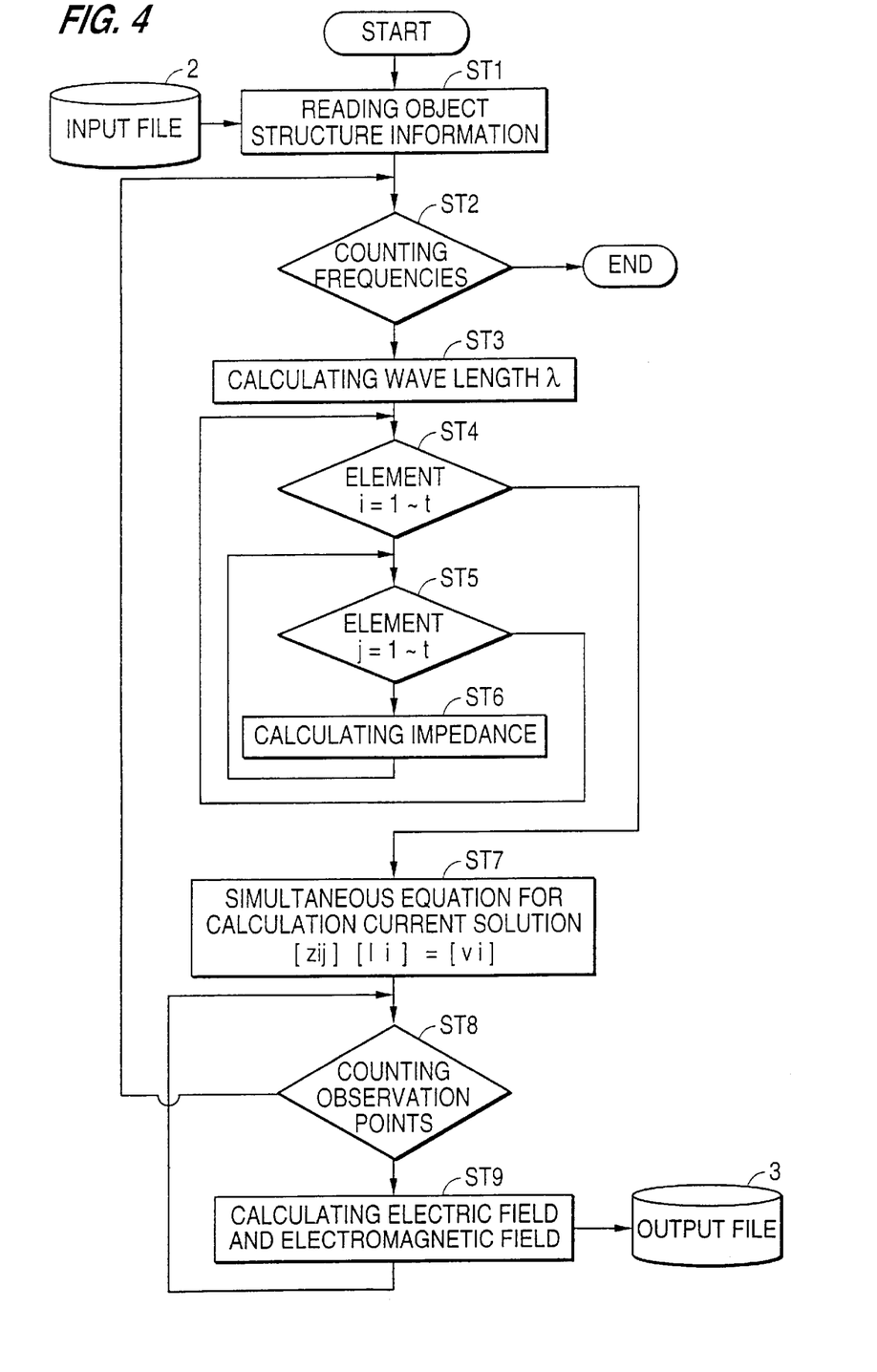
FIG. 4 is a flowchart of the simulation program of the present invention.

Described below are the process performed by the simulation program 14 and then the process performed by the preprocess program 18. FIG. 4 shows an example of the flowchart of the process performed by the simulation program 14.

When the simulation program 14 is activated, it first reads the divided structure information of the object electric circuit device from the input file 12 as shown in the flowchart shown in FIG. 4. Then, in step 2, it determines whether or not the process has been completed on all frequencies stored in the calculated frequency memory 17. If not, the simulation program 14 selects one of the unprocessed frequencies stored in the calculated frequency memory 17, and then calculates the wave length $\lambda$ of the selected frequency in step 3.

Then, in step 4, one of the t unprocessed divided elements is selected to calculate the impedance $Z^o{}_{cc}$ between divided metals; the impedance $Z^o{}_{cd}$ and $Z^o{}_{dc}$ between a divided metal and dielectric portion; the impedance $Z^o{}_{dd}$ and $Z^d{}_{dd}$ between divided dielectric portions; the admittance $Y^o{}_{dd}$ and $Y^d{}_{dd}$ between divided dielectric portions; the reactance $B^o{}_{cd}$ and $B^o{}_{dc}$ between a divided metal and dielectric portion; and the reactance $B^o{}_{dd}$ and $B^d{}_{dd}$ between divided dielectric portions. The superscript "$o$" indicates a value obtained in the atmosphere. The superscript "$d$" indicates a value obtained within a dielectric portion. The subscript "$c$" indicates a metal. The subscript "$d$" indicates a dielectric portion. The subscript "$cc$" indicates the correlation from a metal to a metal. The subscript "$dd$" indicates the correlation between a dielectric portion to a dielectric portion. The subscript "$cd$" indicates the correlation from a dielectric portion to a metal. The subscript "$dc$" indicates the correlation from a metal to a dielectric portion.

When it is determined that a divided element is selected in step 4, another divided element is selected from the t divided elements as the pair processed in the impedance calculation, etc. in step 5. When it is determined that all divided elements have been selected in step 5, control is returned to step 4. If it is determined that an unprocessed divided element has been selected, control is then passed to step 6, the impedance, etc. ($Z^o{}_{cc}$, $Z^o{}_{cd}$, $Z^o{}_{dc}$, $Z^o{}_{dd}$, $Z^d{}_{dd}$, $Y^o{}_{dd}$, $Y^d{}_{dd}$, $B^o{}_{cd}$, $B^o{}_{dc}$, $B^o{}_{dd}$, and $B^d{}_{dd}$) between the two selected divided elements is calculated using the wave length $\lambda$ calculated in step 3, and control is returned to step 5.

If it is determined that all divided elements have been selected in step 4, that is, if it is determined that the calculation has been completed on all impedance, etc., then control is passed to step 7 to use the calculated impedance, etc.; the wave source V read from the input file 12 and driven at the frequency selected in step 2; the electric current $I_c$ in the divided metal elements; the equivalent electric current $I_d$ on the surface of the divided dielectric elements; and the equivalent electromagnetic current M on the surface of the divided dielectric elements to derive:

the simultaneous equations produced according to the moment method under the boundary condition that the metal surface indicates the electric field value of 0

$$[Z^o{}_{cc}][I_c]+[Z^o{}_{cd}][I_d]+[B^o{}_{cd}][M]=[V];$$

the simultaneous equations produced according to the moment method under the boundary condition that the tangent components of the electric field are equal on either sides of the boundaries of the dielectric portion $$[Z^o{}_{dc}][I_c]+[Z^o{}_{dd}+Z^d{}_{dd}][I_d]+[B^o{}_{dd}+B^d{}_{dd}][M]=[0];$$

and the simultaneous equations produced according to the moment method under the boundary condition that the tangent components of the electric field are equal on either sides of the boundaries of the dielectric portion $$[B^o{}_{dc}][I_c]+[B^o{}_{dd}+B^d{}_{dd}][I_d]+[-Y^o{}_{dd}-Y^d{}_{dd}][M]=[0]$$

Solving the simultaneous equations according to the moment method provides the electric current $I_c$ in the divided metal elements; the equivalent electric current $I_d$ on the surface of the divided dielectric elements; and the equivalent electromagnetic current M on surface of the divided dielectric elements.

In step 8, it is determined by counting the processed observation points whether or not the process has been completed on all entered observation points. If yes, control is returned to step 2. If not, control is passed to step 9 and the electromagnetic field intensity brought by the calculated $I_c$, $I_d$, and M to the observation points is obtained by the given equation. The result is stored in the output file 13 and control is returned to step 8.

Thus, the simulation program 14 receives the divided structure information about the object electric circuit device from the input file 12 and calculates according to the moment method the electromagnetic field intensity of the frequencies generated by the electric circuit device and stored in the calculated frequency memory 17.

Described below is the process performed by the preprocess program 18.

Figure 5:
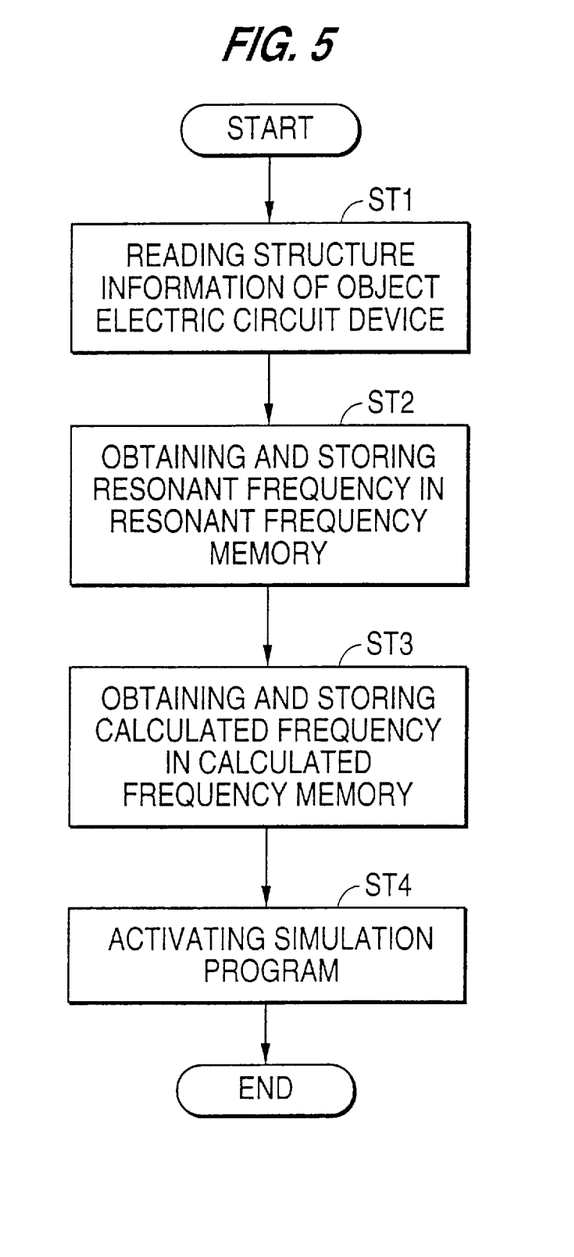
FIG. 5 is a flowchart (1) of the preprocess program of the present invention.
Figure 6:
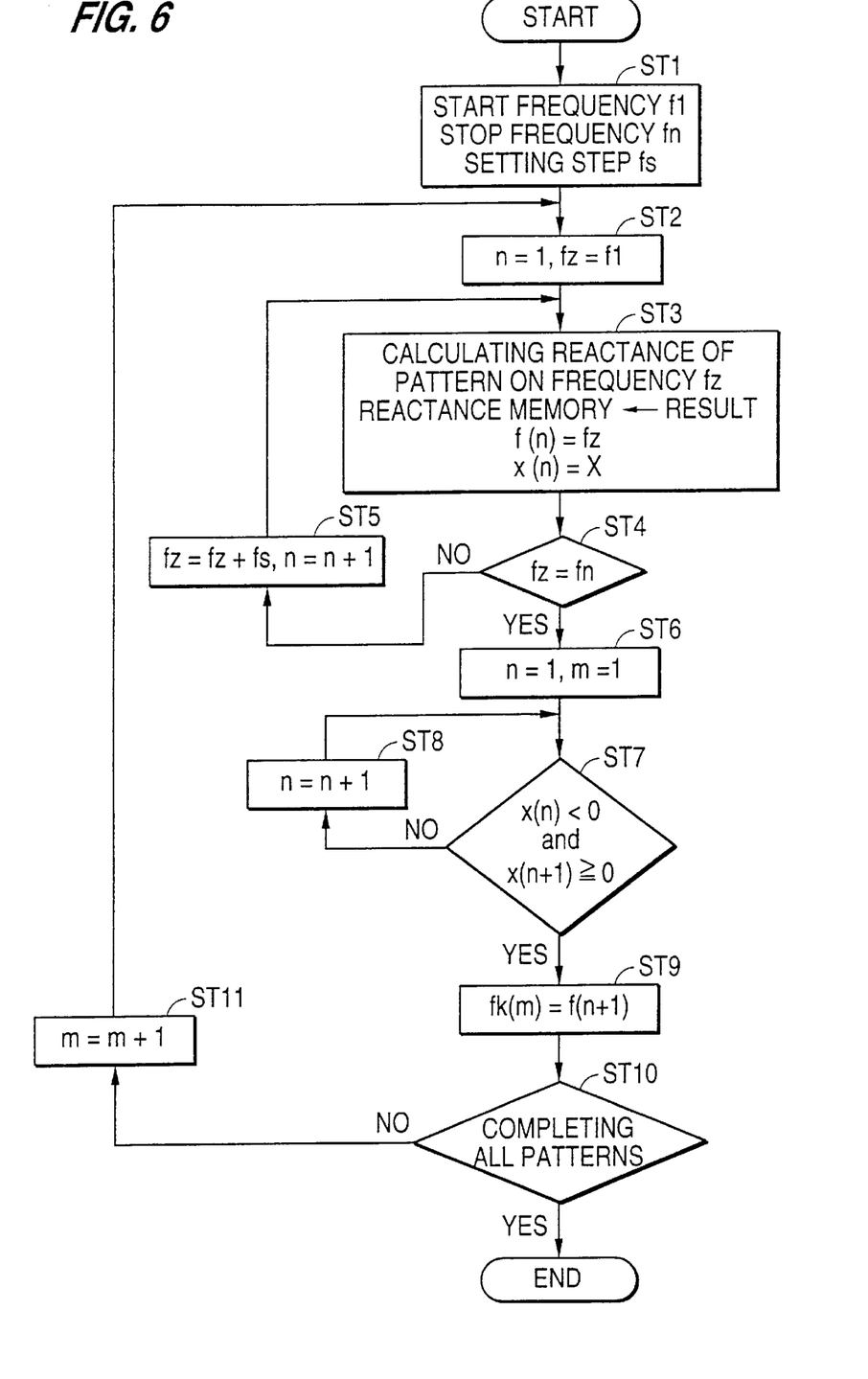
FIG. 6 is a flowchart (2) of the preprocess program of the present invention.
Figure 7:
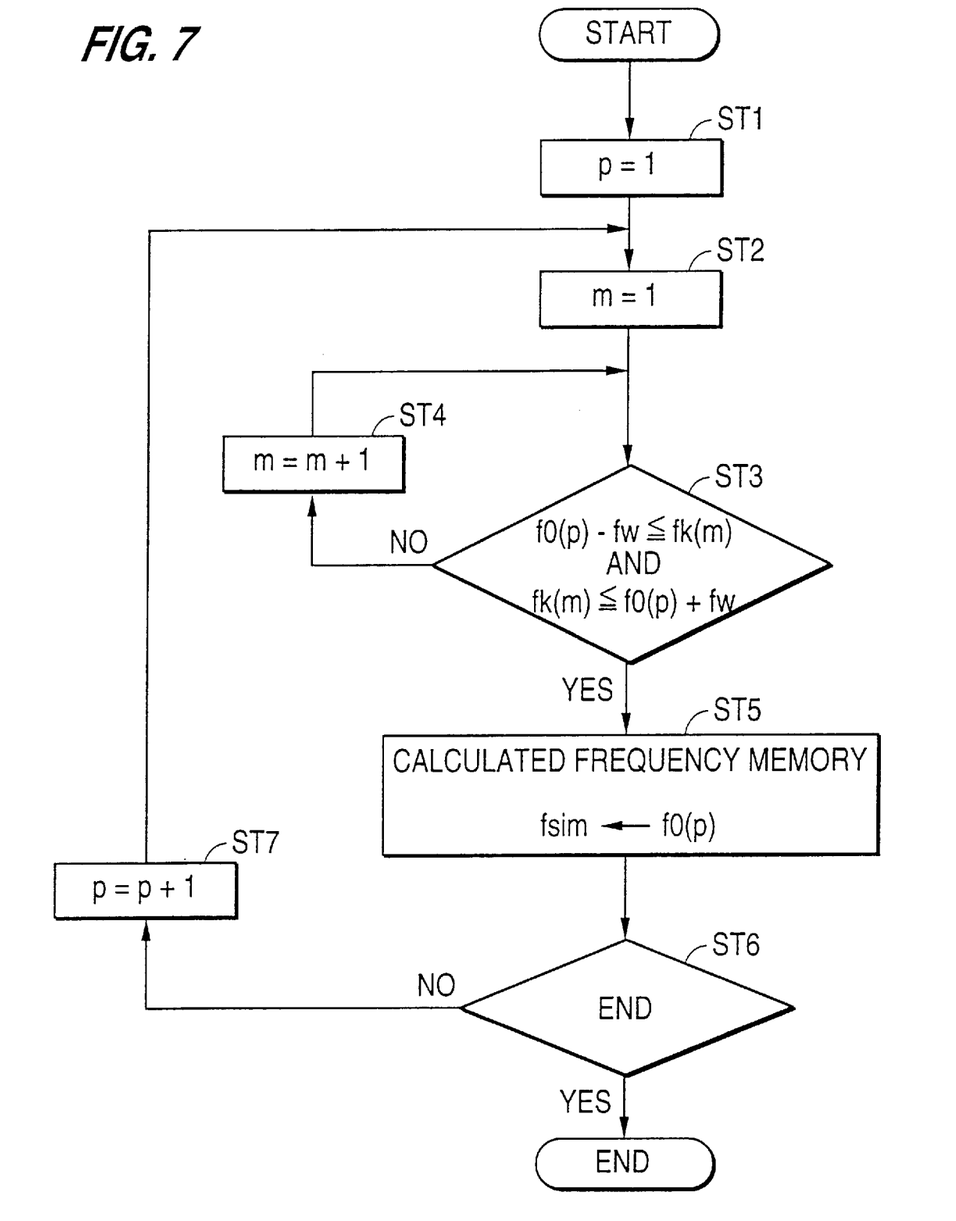
FIG. 7 is a flowchart (3) of the preprocess program of the present invention.

FIGS. 5 through 7 show an embodiment of the process performed by the preprocess program 18. Upon receipt of a request to calculate the electromagnetic field intensity, the preprocess program 18 reads the structure information about the object electric circuit device from the input file 12 in step 1 as shown in the flowchart shown in FIG. 5. Then, in step 2, the resonant frequency of the object electric circuit device is obtained and stored in the resonant frequency memory 16. In step 3, the object frequency (calculated frequency) to be processed by the simulation program 14 is obtained and stored in the calculated frequency memory 17. Finally, in step 4, the simulation program 14 is activated.

FIG. 6 is a detailed flowchart of the process in step 2 shown in FIG. 5. FIG. 7 is a detailed flowchart of the process in step 3 shown in FIG. 5. That is, when the preprocess program 18 starts calculating the resonant frequency in step 2 in the flowchart shown in FIG. 5, it first sets the start frequency fl, stop frequency fn, and step frequency fs in step 1 as shown in the flowchart shown in FIG. 5. In step 2, the variable n is set to 1 and the object process frequency fz is set to fl.

In step 3, a circuit pattern of the object electric circuit device is selected and the reactance of the selected circuit pattern is calculated. The obtained reactance value X (=X (n)) is stored in the reactance memory (omitted in FIG. 3) corresponding to the process frequency fz (=f(n)). In the calculation of the reactance, the impedance Zin viewed from the sending terminal to the terminating equipment is calculated by the following equation with the circuit pattern represented as an equivalent circuit of the terminal impedance Ze, characteristic impedance Zo, transmission constant $\gamma$ and pattern length 1. The imaginary part of the Zin is specified for the calculation.

$$Zin = Zo \times \frac{Ze + jZo \times \tanh\gamma l}{Zo + jZe \times \tanh\gamma l}$$

In step 4, it is determined whether or not the process frequency fz has reached the stop frequency fn. If not, control is passed to step 5 to update the process frequency fz and the variable n according to "fz=fz D fs and n=n+1". Then, control is returned to step 3. If the determination indicates "yes", that is, if the reactance calculation for the frequency areas fl through fn of the selected circuit pattern has been completed, control is passed to step 6, and the variables n and m are set to 1. The variable n indicates the entry number of the reactance memory, and the variable m indicates the entry number of the resonant frequency memory 16.

Figure 8A:
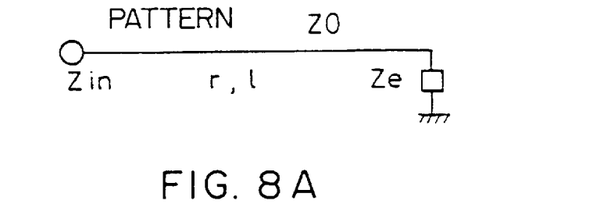
FIGS. 8A and 8B show the calculation of the resonant frequency of the present invention.
Figure 8B:
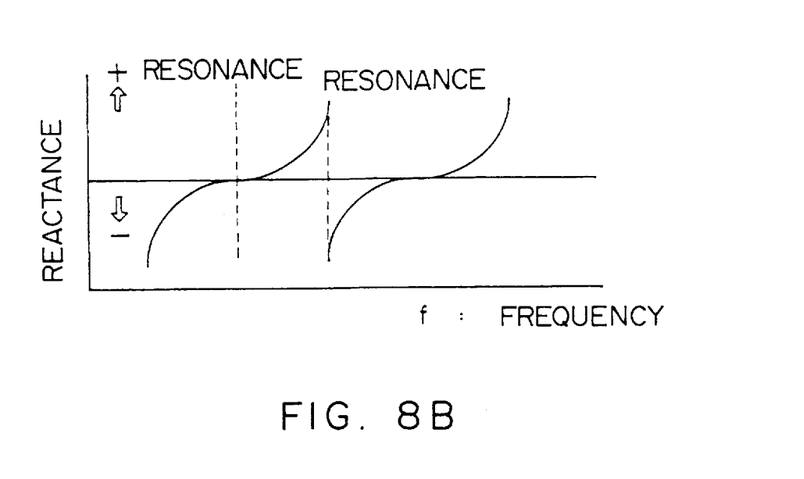

In step 7, the reactance values X(n) and X(n+1) are read from the reactance memory to determine whether or not X(n)<0 and X(n+1)>0 are effective. If not, control is passed to step 8 and the variable m is updated according to "m=n+1". Then, control is returned to step 7. If the determination indicates "yes", that is, if the reactance value X(n+1) approximately indicating zero is obtained as a resonant point as shown in FIG. 8B, then control is passed to step 9 and the frequency f(n+1) corresponding to the reactance value X(n+1) is entered in the resonant frequency memory 16 pointed to by the variable m (hereinafter, the entered frequency of the m-th entry of the resonant frequency memory 16 is represented by fk(m)).

In step 10, it is determined whether or not the process has been completed on all circuit patterns of the object electric circuit device. If yes, the process terminates. If not, control is passed to step 11 and the variable m is updated according to M=m+1. The control is returned to step 2 to proceed with the next circuit pattern.

Thus, if the preprocess program 18 has started the calculation of the resonant frequency in step 2 of the process shown in FIG. 5, it calculates the resonant frequencies of the object electric circuit device according to the flowchart shown in FIG. 6, and stores them in the resonant frequency memory 16.

When the preprocess program 18 has started the calculation of the frequency in step 3 of the process shown in FIG. 5, it first sets the variable p to 1 in step 1, and then sets the variable m to 1 in step 2. The variable m indicates the entry number of the resonant frequency memory 16 and the variable p indicates the entry number of the wave source frequency memory 15. Hereinafter, the entry frequency of the p-th entry of the wave source frequency memory 15 is represented by f0(p).

In step 3, the error value fw is set. It is determined whether or not the following equation is effective between the entry frequency fk(m) of the resonant frequency memory 16 and the entry frequency f0(p) of the wave source frequency memory 15 pointed to by the variable p.

$$f0(p)-fw \leq fk(m) \leq f0(p)+fw$$

As a result of the determination, it is determined whether or not the fk(m) matches the f0(p) in approximation.

If the determination indicates non-coincidence in step 3, control is passed to step 4 to update the variable m according to "m=m+1". Then, control is returned to step 3. When the determination indicates coincidence, control is passed to step 5 and the frequency f0(p) matching the resonant frequency fk(m) is entered to the calculated frequency memory 17. In step 6, it is determined whether or not the process has been completed on all frequencies entered in the wave source frequency memory 15. If yes, the process terminates. If not, control is passed to step 7 to update the variable p according to "P=P+1". Then, control is returned to step 2.

When the preprocess program 18 starts calculating the frequency in step 3 of the flowchart shown in FIG. 5, the object frequencies are obtained by the simulation program 14 according to the flowchart shown in FIG. 7, and are stored in the calculated frequency memory 17.

As described above, the simulation program 14 calculates according to the moment method the electromagnetic field intensity of the frequencies generated by the object electric circuit device and stored by the calculated frequency memory 17. The preprocess program 18 selects one of the frequencies stored in the wave source frequency memory 15 (frequency which can be generated by the object electric circuit device) as matching the resonant frequency of the circuit pattern of the object electric circuit device, and stores it in the calculated frequency memory 23.

That is, according to the present invention, all frequencies stored in the wave source frequency memory 15 are not processed in calculating the electromagnetic field intensity, but the electromagnetic field intensity of only the frequencies matching the resonant frequency is calculated. For example, when the object electric circuit device has a wave source driven at the basic frequency of 10 MHz, the wave source frequency memory 15 stores the frequencies 10 MHz, 20 MHz, 30 MHz, 40 MHz, 50 MHz, . . . . However, the electromagnetic field intensity is not calculated for all the frequencies, but the frequencies matching the resonant frequency, that is, only the frequencies that may generate high electromagnetic field intensity, are processed in calculating the electromagnetic field intensity according to the present invention.

If the object electric circuit device has different wave sources driven at different frequencies, the simulation program 14 performs a different simulation process for each wave source. For example, assuming that the object electric circuit device has circuit parts having the wave sources driven at the basic frequencies of 7 MHz and 10 MHz, the simulation process is performed by driving at 42 MHz the circuit part having the wave source driven at the basic frequency of 7 MHz when the resonant frequency is 42 MHz, and is performed by driving at 60 MHz the circuit part having the wave source driven at the basic frequency of 10 MHz when the resonant frequency is 60 MHz.

According to the flowchart shown in FIG. 6, the preprocess program 18 obtains the resonant frequency of the circuit pattern of the object electric circuit device to calculate the resonant frequency of the object electric circuit device. However, obtaining the resonant frequency through other structures can also be effective in obtaining the resonant frequency of the object electric circuit device. FIGS. 9A, 9B, 10A and 10B show examples of the structures.

Figure 9A:
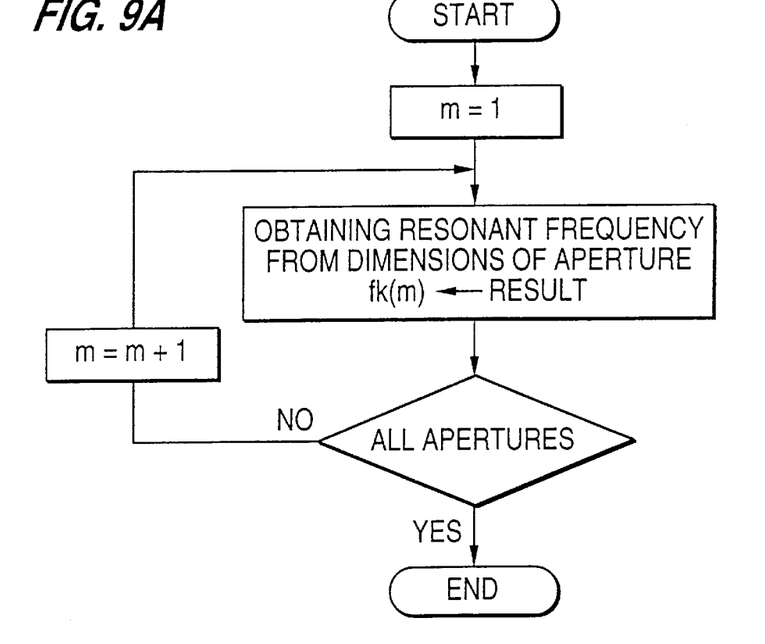
FIGS. 9A and 9B are a flowchart (4) of the preprocess program of the present invention.
Figure 11A:
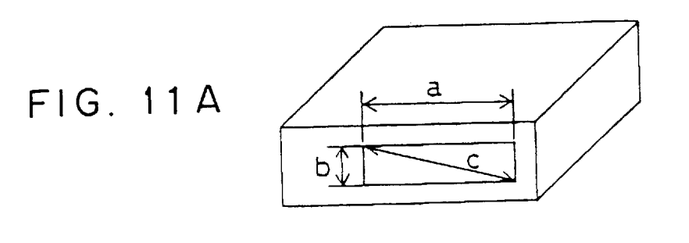
FIGS. 11A, 11B, 11C and 11D show the calculation of the resonant frequency of the present invention.

According to the flowchart in FIG. 9A, the preprocess program 18 obtains the resonant frequency regulated by the dimensions of the aperture of the object electric circuit device and stores it in the resonant frequency memory 16. That is, with the aperture shown in FIG. 11A, the resonant frequencies represented by the following equations are stored in the resonant frequency memory 16. $C_o$ in the equations indicates the velocity of light.

$$f_1 = \frac{C_0}{2a}, f_2 = \frac{C_0}{2b}, f_3 = \frac{C_0}{2c}$$

Figure 9B:
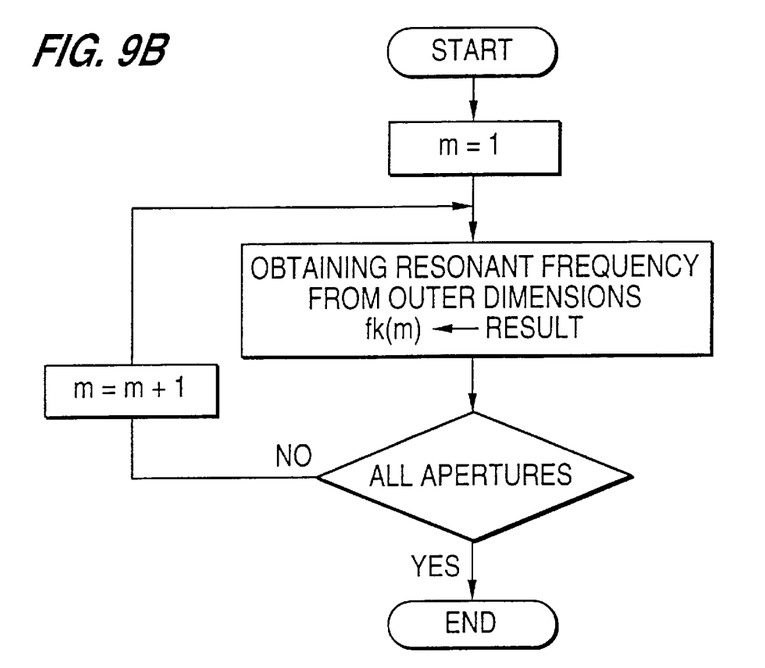
Figure 11B:
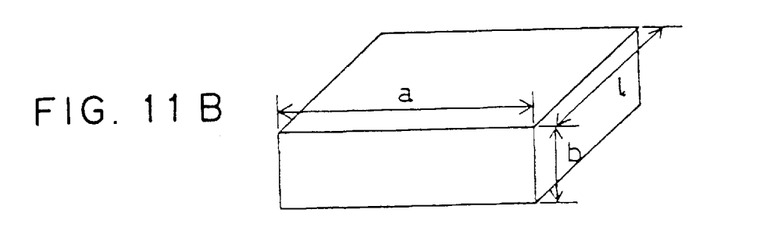

According to the flowchart shown in FIG. 9B, the preprocess program 18 obtains the resonant frequency regulated by the outer dimensions (including an internal device) of the object electric circuit device and stores it in the resonant frequency memory 16. That is, with the form shown by in FIG. 11B, the resonant frequencies represented by the following equations are stored in the resonant frequency memory 16.

$$f_1 = \frac{C_0 \times \sqrt{\left(\frac{1}{a}\right)^2 + \left(\frac{1}{l}\right)^2}}{2}$$

$$f_2 = \frac{C_0 \times \sqrt{\left(\frac{1}{a}\right)^2 + \left(\frac{1}{b}\right)^2}}{2}$$

$$f_3 = \frac{C_0 \times \sqrt{\left(\frac{1}{b}\right)^2 + \left(\frac{1}{l}\right)^2}}{2}$$

Figure 10A:
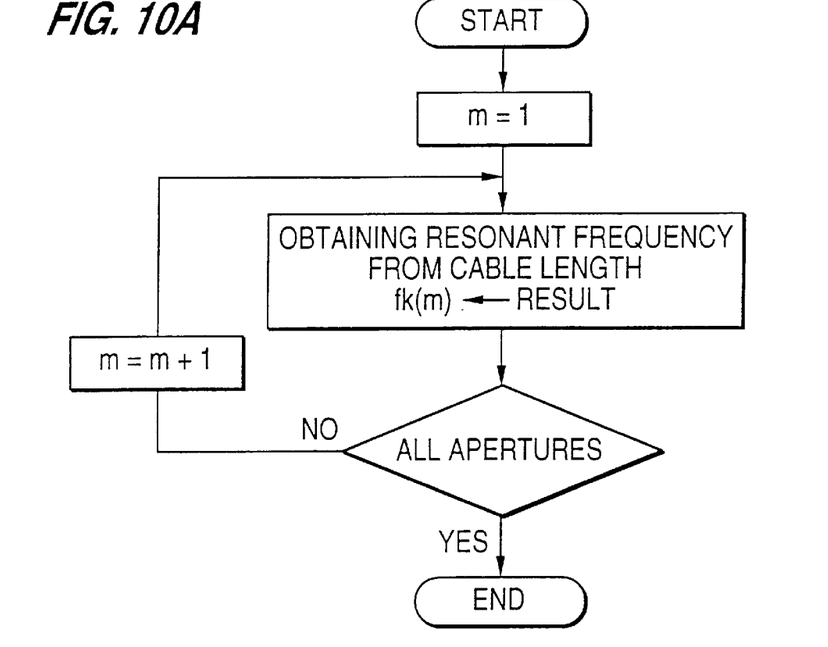
FIGS. 10A and 10B are a flowchart (5) of the preprocess program of the present invention.
Figure 11C:
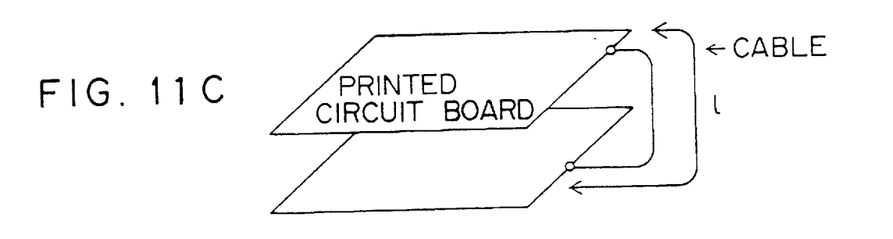

According to the flowchart shown in FIG. 10A, the preprocess program 18 obtains the resonant frequency regulated by the length of the cable of the object electric circuit device, and stores it in the resonant frequency memory 16. That is, the resonant frequency represented by the following equation is generated from the form shown by in FIG. 11C. The obtained results are stored in the resonant frequency memory 16.

$$f = \frac{C_0}{4 \times l}$$

Figure 10B:
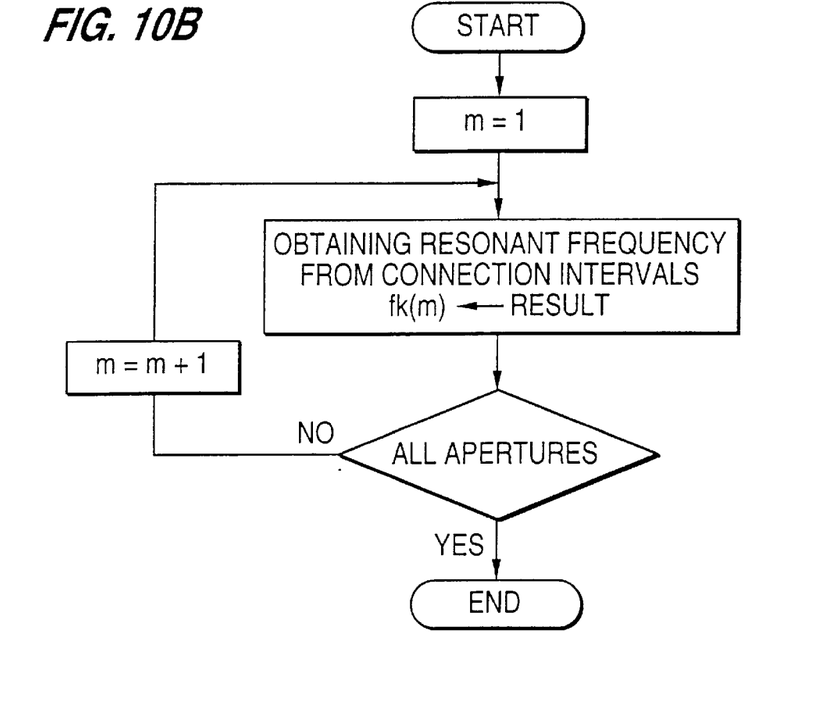
Figure 11D:
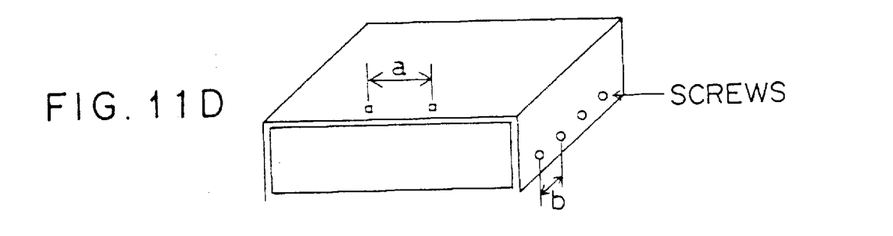

According to the flowchart shown in FIG. 10B, the preprocess program 18 obtains the resonant frequency regulated by the connection interval of the object electric circuit device, and stores it in the resonant frequency memory 16. That is, the resonant frequency represented by the following equation is generated from the connection interval shown in FIG. 11D. The obtained results are stored in the resonant frequency memory 16.

$$f_1 = \frac{C_0}{2 \times a}, f_2 = \frac{C_0}{2 \times b}$$

These flowcharts shown in FIGS. 6, 9A, 9B, 10A and 10B can be combined to obtain the resonant frequency and store it in the resonant frequency memory 16.

The present invention has been described above by referring to the attached drawings, but is not limited to these applications. For example, the present invention can be applied to the electromagnetic field intensity calculating device for calculating the electromagnetic field intensity based on other algorithms other than the moment method.

As described above, the electromagnetic field intensity calculating device according to the present invention does not calculate the electromagnetic field intensity for all frequencies generated by an object electric circuit device, but calculates the electromagnetic field intensity on the frequency selected as possibly generating a large electromagnetic field intensity as a resonant frequency. Thus, the present invention can quickly calculate required electromagnetic field intensity.

What is claimed is:

1. An electromagnetic field intensity calculating device for simulating electromagnetic field intensity generated by an object electric circuit device with a wave source by processing an object frequency generated by the object electric circuit device to simulate the electromagnetic field intensity for the object frequency, comprising:

calculating means for calculating a resonant frequency of the object electric circuit device; and retrieving means for retrieving from a plurality of object frequencies that harmonic frequency of a frequency generated by the wave source which is approximate to the resonant frequency calculated by said calculating means.

2. The electromagnetic field intensity calculating device according to claim 1, wherein said electromagnetic field intensity is simulated by electromagnetic field intensity calculating means according to the resonance frequency calculated by said calculating means.

3. The electromagnetic field intensity calculating device according to claim 1, wherein said calculating means calculates the resonant frequency from an input impedance of a circuit of the electric circuit device.

4. The electromagnetic field intensity calculating device according to claim 1, wherein said calculating means calculates the resonant frequency from a physical dimension of an aperture of a structure of the electric circuit device.

5. The electromagnetic field intensity calculating device according to claim 1, wherein said calculating means calculates the resonant frequency from an outer dimension of a structure of the electric circuit device.

6. The electromagnetic field intensity calculating device according to claim 1, wherein said calculating means calculates the resonant frequency from a length of a cable of the electric circuit device.

7. The electromagnetic field intensity calculating device according to claim 1, wherein said calculating means calculates the resonant frequency from intervals of connection points in a structure of the electric circuit device.

8. The electromagnetic field intensity calculating device according to claim 1, wherein said retrieving means compares the frequency obtained by said calculating means with a wave source frequency predetermined in the object frequency and outputs the harmonic frequency of the wave source frequency when the frequency obtained by said calculating means is in a predetermined range of the wave source frequency.

9. A electromagnetic field intensity calculating method, comprising the steps of:

calculating a resonant frequency of an object electric circuit device according to structure information about an electric circuit device with a wave source;

retrieving a frequency in measuring electromagnetic field intensity of the electric circuit device according to the resonant frequency obtained by the calculating step; and calculating electric field intensity for measuring the electric field intensity of the electric circuit device based on the frequency obtained by the retrieving step.

10. The electromagnetic field intensity calculating method according to claim 9, wherein said retrieved frequency is the harmonic frequency of a frequency of the wave source provided in the object electric device and is approximate to the resonant frequency of the object electric device.

11. The electromagnetic field intensity calculating method according to claim 9, wherein said retrieving step compares the frequency obtained by said resonant frequency calculating step with the wave source frequency predetermined from the object frequency, and determines the object frequency of said electromagnetic field intensity calculating step when the frequency obtained by said resonant frequency calculating step refers to a frequency in a predetermined range of the wave source frequency.

12. The electromagnetic field intensity calculating method according to claim 9, wherein said retrieving step retrieves the frequency by comparing a wave source frequency predetermined in the object frequency with information obtained from the electric circuit device.

13. The electromagnetic field intensity calculating method according to claim 9, wherein said resonant frequency calculating step calculates the resonant frequency from an input impedance of a circuit in the electric circuit device.

14. The electromagnetic field intensity calculating method according to claim 9, wherein said resonant frequency calculating step calculates the resonant frequency from a physical dimension of an aperture of a structure of the electric circuit device.

15. The electromagnetic field intensity calculating method according to claim 9, wherein said resonant frequency calculating step calculates the resonant frequency from an outer dimension of a structure of the electric circuit device.

16. The electromagnetic field intensity calculating method according to claim 9, wherein said resonant frequency calculating step calculates the resonant frequency from a length of a cable of the electric circuit device.

17. The electromagnetic field intensity calculating method according to claim 9, wherein said resonant frequency calculating step calculates the resonant frequency from intervals of connection points in a structure of the electric circuit device.

18. An electromagnetic field intensity calculating device for simulating electromagnetic field intensity generated by an object electric circuit device with a wave source by processing an object frequency generated by the object electric circuit device to simulate the electromagnetic field intensity for the object frequency, comprising:

resonance frequency calculating unit calculating a resonant frequency of the object electric circuit device; and retrieving unit retrieving from a plurality of object frequencies a harmonic frequency of the wave source which approximates the resonant frequency calculated by said resonance frequency calculating unit, whereby said electromagnetic field intensity is simulated using said harmonic frequency.

19. The electromagnetic field intensity calculating device according to claim 18, wherein said resonance frequency calculating unit calculates the resonant frequency from an input impedance of a circuit of the electric circuit device.

20. The electromagnetic field intensity calculating device according to claim 18, wherein said resonance frequency calculating unit calculates the resonant frequency from a physical dimension of an aperture of a structure of the electric circuit device.

21. The electromagnetic field intensity calculating device according to claim 18, wherein said resonance frequency calculating unit calculates the resonant frequency from an outer dimension of a structure of the electric circuit device.

22. The electromagnetic field intensity calculating device according to claim 18, wherein said resonance frequency calculating unit calculates the resonant frequency from a length of a cable of the electric circuit device.

23. The electromagnetic field intensity calculating device according to claim 18, wherein said resonance frequency calculating unit calculates the resonant frequency from intervals of connection points in a structure of the electric circuit device.

\* \* \* \* \*

UNITED STATES PATENT AND TRADEMARK OFFICE
CERTIFICATE OF CORRECTION

PATENT NO.: 5,815,414
DATED : September 29, 1998
INVENTOR(S): Funaki et al

It is certified that error appears in the above-identified patent and that said Letters Patent is hereby corrected as shown below:

Col. 2, line 39, Begin new paragraph with "Fig. 7".

Col. 4, line 23, after "data" delete ",".

Col. 7, line 19, change ">" to $--\geq--$;
line 57, In the equation, change "$\underline{\leq}$" to $--\leq--$ (both occurrences).

Signed and Sealed this

Second Day of March, 1999

Attest:

Q. TODD DICKINSON

*Attesting Officer*          *Acting Commissioner of Patents and Trademarks*